United States Patent

Agata et al.

[19]

[11] Patent Number: 6,118,723
[45] Date of Patent: Sep. 12, 2000

[54] SEMICONDUCTOR MEMORY DEVICE

[75] Inventors: Masashi Agata; Toshiaki Kawasaki, both of Osaka, Japan

[73] Assignee: Matsushita Electric Industrial Co., Ltd., Osaka, Japan

[21] Appl. No.: 09/326,230

[22] Filed: Jun. 4, 1999

[30] Foreign Application Priority Data

Jun. 9, 1998 [JP] Japan .................................. 10-160936

[51] Int. Cl.$^7$ .................................................. G11C 8/00
[52] U.S. Cl. .................. 365/230.03; 365/63; 365/230.06
[58] Field of Search ......................... 365/230.06, 230.03, 365/63

[56] References Cited

U.S. PATENT DOCUMENTS

| | | | |
|---|---|---|---|
| 5,596,542 | 1/1997 | Sugibayashi et al. | 365/230.06 |
| 5,940,343 | 8/1999 | Cha et al. | 365/230.06 |
| 5,986,966 | 11/1999 | Nagata | 365/230.06 |
| 6,026,647 | 2/2000 | Ryu et al. | 365/230.06 |

*Primary Examiner*—Son T. Dinh
*Attorney, Agent, or Firm*—Harness, Dickey & Pierce, P.L.C.

[57] ABSTRACT

A semiconductor memory device includes: an array of memory cells that is divided into a plurality of sub-arrays; main word lines; sub-word lines; sub-word select lines; and sub-word drivers. A predetermined number of main word lines are associated with a block of sub-arrays arranged on the same row, and extend over all of these sub-arrays. A set of sub-word lines are provided per sub-array and driven by the same number of sub-word drivers corresponding thereto. Each sub-word select line consists of: a parallel portion, which is placed in parallel to the main word lines; and a plurality of vertical portions crossing the main word lines at right angles. Each sub-word driver is selected by specifying, in combination, one of the main word lines and one of the sub-word select lines. In this arrangement, a difference in signal propagation delay between a main word line and an associated parallel portion of a sub-word select line can be minimized, thus remarkably increasing the operating speed of a semiconductor memory device like a DRAM.

11 Claims, 6 Drawing Sheets

SEMICONDUCTOR MEMORY DEVICE

BACKGROUND OF THE INVENTION

The present invention relates to a semiconductor memory device, and more particularly relates to an improved dynamic random access memory (DRAM).

In recent years, DRAMs have been drastically downsized to further increase the number of semiconductor devices, including memories like DRAMs, integrated on a single chip. In order to ensure the selection of a desired word line from an array of such miniaturized memories, a so-called "hierarchical word line implementation" has been adopted these days with the pitch of metal interconnects somewhat increased. This technique is disclosed in "A 29-ns 64-Mb DRAM with Hierarchical Array Architecture", IEEE J. Solid State Circuits, Vol. 31 (1996), pp. 1302–1307, for example.

FIG. 7 illustrates this exemplary prior art DRAM disclosed in this document. In the DRAM shown in FIG. 7, an array a of memory cells (hereinafter, simply referred to as an "array a") is divided into a plurality of sub-arrays b. A set of sub-arrays b, which are arranged on the same row, collectively forms a single block 0, 1, 2, 3 and so on. A plurality of main word lines GWL are also provided for this array a. Several ones of the main word lines GWL, associated with a single block, extend over all of the sub-arrays b included in the block. It should be noted that only a single main word line GWL is illustrated in FIG. 7 for the sake of simplicity. And each of these word lines GWL is driven by an associated row decoder (not shown) to be selected responsive to a predetermined address signal. A plurality of (e.g., four in FIG. 7 as indicated by the bold lines) sub-word select lines Dxi are further arranged to cross the main word lines GWL at right angles in this array a. Each of these sub-word select lines Dxi is shared in common by an associated set of sub-arrays b arranged on the same column. In response to a common address signal composed of several (e.g., two) bits, one of the sub-word select lines Dxi is selected. Once one of the main word lines GWL and one of the sub-word select lines Dxi have been selected, one of a plurality of sub-word drivers (not shown) is automatically selected. The selected sub-word driver drives one of a plurality of sub-word lines (not shown) that are connected to respective memory cells.

Next, the operation of this prior art DRAM will be described. Responsive to a row address supplied, one of the row decoders is selected and a single main word line GWL, which is connected to the selected row decoder, is selected and enabled. At the same time, in response to another row address, which is different from the former row address for selecting the single main word line, one of the sub-word select lines Dxi is selected and enabled. Once the particular main word line GWL and the particular sub-word select line Dxi have been enabled at a desired sub-array b, associated one of the sub-word drivers (not shown) is selected. And a single sub-word line that is connected to the selected sub-word driver is selected and enabled. As a result, information is read out from a memory cell connected to the sub-word line.

In this conventional DRAM with the hierarchical word line implementation, a predetermined time margin is required between the enablement or disablement of a main word line and the enablement or disablement of a sub-word select line. This point will be detailed below. A sub-word driver, including only n-channel MOS transistors, is implemented as a self-booster to increase a voltage level on the associated sub-word line to a boosted level. In accordance with this self-boosting technique, if a main word line is selected, the gate voltage at a sub-word driver increases. At a point in time when the gate voltage reaches a level sufficiently higher than the boosted level, the associated sub-word select line should be enabled. Accordingly, a timing margin should be secured for self-boosting between the enablement of the main word line and that of the sub-word select line. No matter whether a sub-word driver includes only n-channel MOS transistors or is a CMOS including both n- and p-channel MOS transistors, the sub-word driver can disable the associated sub-word line faster if the driver turns OFF the MOS transistors between the associated sub-word select line and the sub-word line by disabling the sub-word select line, not just by turning ON the n-channel MOS transistors between the sub-word line and the ground. In this case, in order to disable the sub-word line effectively by disabling the sub-word select line, the main word line should not be disabled until the sub-word select line has been disabled. That is to say, a timing margin should be provided between the disablement of the sub-word select line and that of the main word line.

In the conventional DRAM with the hierarchical word line implementation, however, the main word lines and the sub-word select lines are arranged to cross each other at right angles over a plurality of sub-arrays. Thus, in enabling a sub-array located far away from the start end of a main word line (i.e., an end of the line closer to a decoder as a signal source), the enablement of a sub-word select line, associated with the sub-array, should be much delayed even if the sub-array is located near the start end of the sub-word select line. This is because the sub-word select line should not be enabled until the main word line has been enabled in this sub-array. That is to say, a large timing margin should be secured between the enablement of the main word line and that of the sub-word select line, thus increasing the time required to access such a DRAM and interfering with the high-speed operation of the DRAM. The same statement applies to a timing margin to be secured between the enablement of a main word line and the disablement of a sub-word select line.

SUMMARY OF THE INVENTION

An object of the present invention is providing a semiconductor memory device, like a DRAM, which can operate much faster by reducing a delay caused by the propagation of a signal between a main word line and a sub-word select line.

In order to achieve this object, a sub-word select line is folded such that part of the line is parallel to the main word lines according to the present invention. In such an arrangement, a difference in signal propagation delay between these two types of lines can be reduced where these lines are parallel to each other. Accordingly, almost no timing margin other than the margin to be secured for each sub-array should be taken into consideration between a main word line and a sub-word select line. As a result, the DRAM can operate much faster.

A semiconductor memory device according to the present invention includes: an array of memory cells arranged in columns and rows, the array being divided into a plurality of sub-arrays; a plurality of main word lines, each said main word line extending over a number of the sub-arrays that are arranged on the same row; a plurality of sub-word select lines; a plurality of sub-word drivers, each said sub-word driver being selected by specifying particular one of the main word lines and particular one of the sub-word select lines in combination, more than one of the sub-word drivers being associated with each said sub-array; and a plurality of sub-word lines, each said sub-word line being driven by associated one of the sub-word drivers and connected to associated one of the memory cells. The sub-arrays are classified into a plurality of blocks, each said block including an associated set of the sub-arrays arranged on the same row. More than one of the sub-word select lines are associated with each said block. Each said sub-word select line includes: a portion placed in parallel to the main word lines; and a plurality of portions that are all connected to the parallel portion and arranged in the respective sub-arrays within the same block to cross the main word lines at right angles.

In one embodiment of the present invention the device may further include: a plurality of row decoders arranged in a direction vertical to the main word lines, each said row decoder driving associated one of the main word lines; and a plurality of sub-word selectors arranged in the same direction as the row decoders, each said sub-word selector being associated with corresponding one of the blocks for selectively driving one of the sub-word select lines provided in the block.

In another embodiment, the device may further include banks of sense amplifiers. Each said bank is associated with one of the sub-arrays. Each said amplifier amplifies a signal stored in associated one of the memory cells. The parallel portion of each said sub-word select line is placed over associated ones of the banks of sense amplifiers.

Another semiconductor memory device according to the present invention includes: an array of memory cells arranged in columns and rows, the array being divided into a plurality of sub-arrays; a plurality of main word lines, each said main word line extending over a number of the sub-arrays that are arranged on the same row; a plurality of sub-word select lines; a plurality of sub-word drivers, each said sub-word driver being selected by specifying particular one of the main word lines and particular one of the sub-word select lines in combination, more than one of the sub-word drivers being associated with each said sub-array; and a plurality of sub-word lines, each said sub-word line being driven by associated one of the sub-word drivers and connected to associated one of the memory cells. The sub-arrays are classified into a plurality of blocks. Each said block includes an associated set of the sub-arrays arranged on the same row. More than one of the sub-word select lines are associated with each said block. Each said sub-word select line includes: a main sub-word select line placed in parallel to the main word lines; and a plurality of auxiliary sub-word select lines. Each of the auxiliary sub-word select lines is placed within each said sub-array to cross the main word lines at right angles and connected to associated ones of the sub-word drivers. The auxiliary sub-word select lines are driven when the main sub-word select line is driven.

In one embodiment of the present invention, the device may further include: a plurality of row decoders arranged in a direction vertical to the main word lines, each said row decoder driving associated one of the main word lines; and a plurality of sub-word selectors arranged in the same direction as the row decoders. Each said sub-word selector is associated with corresponding one of the blocks for selectively driving the main sub-word select line of one of the sub-word select lines provided in the block.

In another embodiment, each said sub-word selector, associated with corresponding one of the blocks, is selected responsive to an address signal. The address signal includes: a signal used for selecting one of blocks; and a signal used for selecting one of the sub-word select lines within the selected block.

In still another embodiment, the device may further include banks of sense amplifiers. Each said bank is associated with one of the sub-arrays. Each said amplifier amplifies a signal stored in associated one of the memory cells. The main sub-word select line of each said sub-word select line is placed over associated ones of the banks of sense amplifiers.

In still another embodiment, the device may further include a plurality of sub-word select line drivers for the respective sub-arrays. Each said sub-word select line driver is provided for, and selected by, associated one of the main sub-word select lines. Each said sub-word select line driver drives a corresponding one of the auxiliary sub-word select lines for associated one of the sub-arrays.

In still another embodiment, the device may further include banks of sense amplifiers. Each said bank being associated with one of the sub-arrays. Each said amplifier amplifies a signal stored in associated one of the memory cells. Each said sub-word select line driver is placed at an intersection between associated one of the banks of sense amplifiers and an associated bank of the sub-word drivers within the associated sub-array.

In still another embodiment, each said sub-word select line driver includes a level shifter for generating a boosted signal level in response to a signal on associated one of the main sub-word select lines. The level shifter makes a signal level on associated auxiliary sub-word select lines higher than the signal level on the main sub-word select line.

In the semiconductor memory device of the present invention, the parallel portion or the main sub-word select line of each sub-word select line is placed in parallel to the main word lines. Accordingly, there is not so much need to take the propagation delay of a signal transmitted through this portion or line into account. That is to say, the difference in signal propagation delay between a main word line and a sub-word select line can be reduced at any sub-array located at any position in the array of memory cells. Thus, almost no timing margin other than the margin to be secured for each sub-array should be taken into consideration between a main word line and a sub-word select line. In other words, unlike the conventional device, a long timing margin should no longer be secured for a sub-array farthest away from the start end of a line. As a result, a DRAM, operating much faster than a conventional DRAM, is realized.

In addition, according to the present invention, the parallel portion or the main sub-word select line of each sub-word select line is placed on an associated bank of sense amplifiers with a lot of free space. Thus, these sub-word select lines can be placed without increasing the layout area.

Moreover, according to the present invention, a sub-word select line driver is placed between the main and auxiliary sub-word select lines of each sub-word select line, and the length of main sub-word select lines is substantially equal to that of main word lines in such a case. Accordingly, the signal load on each main word line is closer to that on each main sub-word select line parallel to the main word line, and the difference in signal propagation delay between the main word line and the main sub-word select line further decreases. That is to say, the timing margin to be secured between main word line and sub-word select line can be further shortened. As a result, the operating speed of the DRAM can be increased even more.

Also, according to the present invention, each sub-word select line driver is placed at an intersection between an associated bank of sense amplifiers and an associated bank of sub-word drivers in a free space. Thus, the sub-word select line drivers can be placed without increasing the layout area.

Furthermore, according to the present invention, a signal level on each auxiliary sub-word select line, i.e., a level on an associated sub-word line, is obtained by a level shifter included in a sub-word select line driver. Thus, a signal level on an associated main sub-word select line can be a voltage lower than the level on the sub-word line. That is to say, the current consumed by the operation of enabling/disabling the main sub-word select line can be reduced. As a result, the DRAM can be operated with lower power consumption.

DESCRIPTION OF THE PREFERRED EMBODIMENTS

Figure 1:
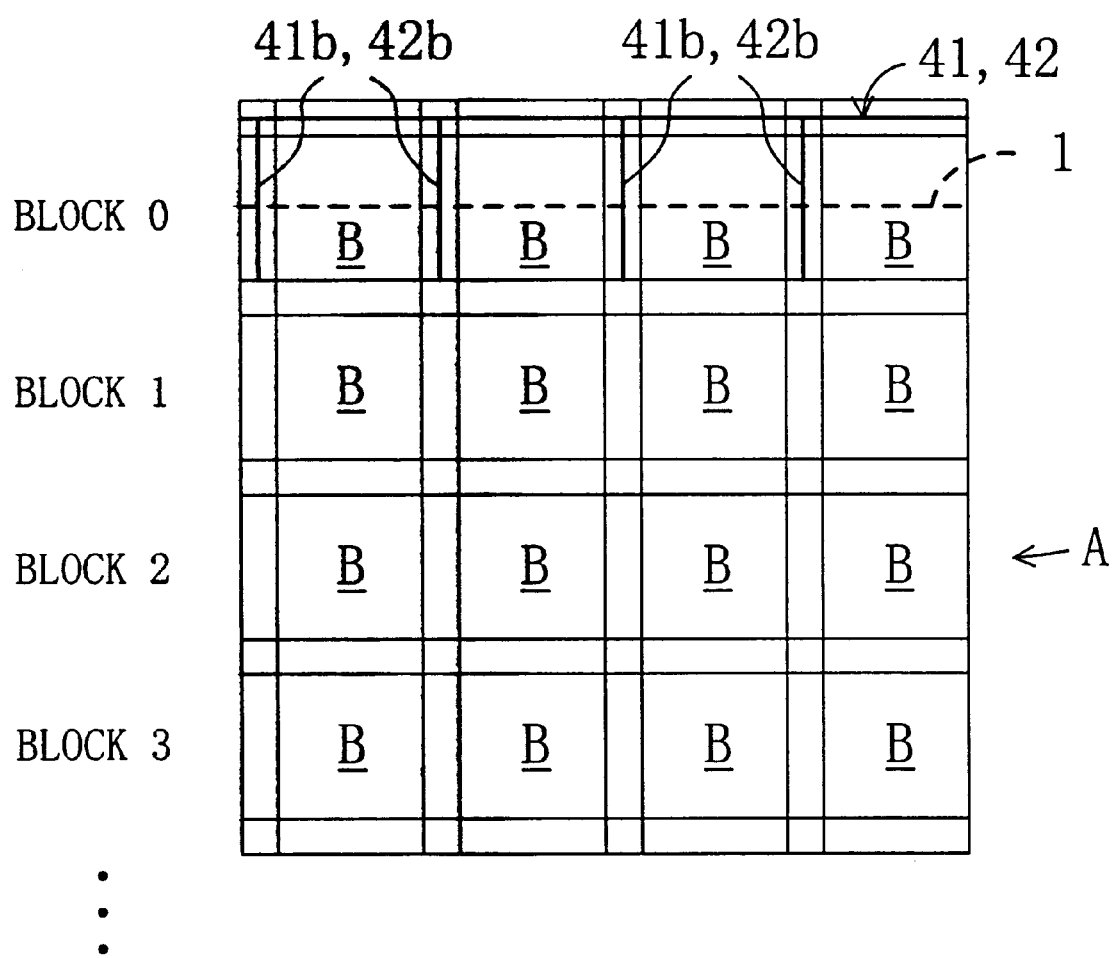
FIG. 1 is a schematic representation illustrating a simplified arrangement of a semiconductor memory device according to a first exemplary embodiment of the present invention.

Hereinafter, preferred embodiments of the present invention will be described with reference to the accompanying drawings. It should be noted that although only a small group of similar components in the memory array device will be identified by the same number of reference numerals used in the drawings, the number of those components actually provided is not limited to that of the illustrated ones. For example, when main word lines are identified by the reference numerals "1, 2, 3, 4, 5, 6", the number of the main word lines is never meant to be limited to six, but a much greater number of main word lines may be provided in actuality.

EMBODIMENT 1

Figure 2:
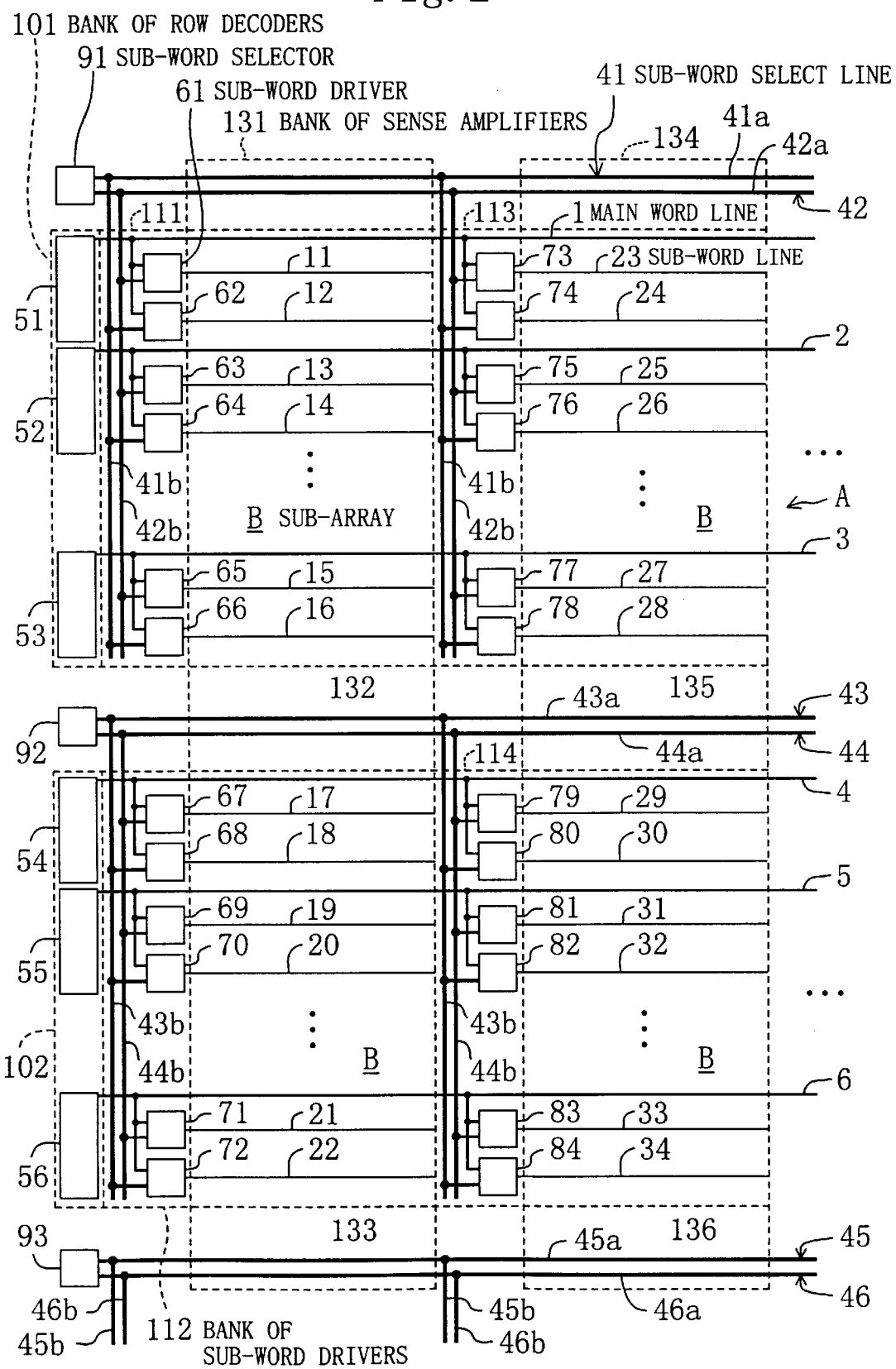
FIG. 2 is a schematic representation illustrating a detailed arrangement of the semiconductor memory device according to the first embodiment.

FIGS. 1 and 2 respectively illustrate simplified and detailed circuit configurations of a semiconductor memory device according to an exemplary embodiment of the present invention. As shown in FIGS. 1 and 2, an array A of memory cells is divided into a plurality of sub-arrays B. A set of sub-arrays B, which are arranged on the same row, collectively form a single Block 0, 1, 2, 3. A plurality of main word lines 1, 2, 3, 4, 5, 6 are also provided for this array A. Several ones of these main word lines are associated with a single block to extend over all of the sub-arrays B on the same row. A plurality of row decoders 51, 52, 53, 54, 55, 56 are vertically arranged along the columns of memory cells to form banks 101, 102 of row decoders for the respective blocks. When one of the row decoders for a particular block is selected, one of the main word lines, which is connected to the selected row decoder, is driven. Also, banks 131, 132, 133, 134, 135, 136 of sense amplifiers are arranged above the respective sub-arrays B.

A plurality of sub-word select lines 41, 42, 43, 44, 45, 46 are placed over the main word lines 1, 2, . . . , 6 in the respective blocks. In this embodiment, two sub-word select lines are provided for each block. Each of the sub-word select lines 41, 42, . . . , 46 includes a parallel portion 41a, 42a, 43a, 44a, 45a, 46a and vertical portions 41b and 42b, 43b and 44b, 45b and 46b. The parallel portions 41a, 42a, . . . , 46a are placed in parallel to the main word lines 1, 2, . . . , 6. Each vertical portion 41b, 42b, . . . , 46b is connected to an associated parallel portion 41a, 42a, . . . , 46a to cross the main word lines 1, 2, . . . , 6 at right angles. A pair of vertical portions 41b and 42b, 43b and 44b, 45b and 46b is associated with each sub-array. The parallel portions 41a, 42a, . . . , 46a are placed over the banks 131, 132, . . . , 136 of sense amplifiers in the respective blocks. On the other hand, the vertical portions 41b, 42b, . . . , 46b are placed over banks 111, 112, 113, 114 of sub-word drivers (to be described later) in the respective blocks. A sub-word selector 91, 92, 93 is provided for each block. These sub-word selectors 91, 92, 93 are arranged in the same direction as the row decoders 51, 52, 56. Each of the sub-word selectors 91, 92, 93 drives one of the sub-word select lines 41 and 42, 43 and 44, 45 and 46 within the associated block.

Each sub-array B is further provided with a set of sub-word drivers 61 through 66, 67 through 72, 73 through 78, 79 through 84, each of these sets forming a bank 111, 112, 113, 114 of sub-word drivers. Each of these sub-word drivers 61, 62, . . . , 84 is connected to an associated main word line and an associated sub-word select line within the sub-array B to which the driver belongs. When these two associated lines are both driven, the sub-word driver is enabled and selected. Each sub-array B further includes the same number of sub-word lines 11 through 16, 17 through 22, 23 through 28, 29 through 34 as the number of the sub-word drivers included therein. These sub-word lines are connected to their associated sub-word drivers. When one of the sub-word drivers is selected, the associated sub-word line is driven by the sub-word driver selected. These sub-word lines 11, 12, . . . , 34 are connected to associated memory cells (not shown).

Figure 3:
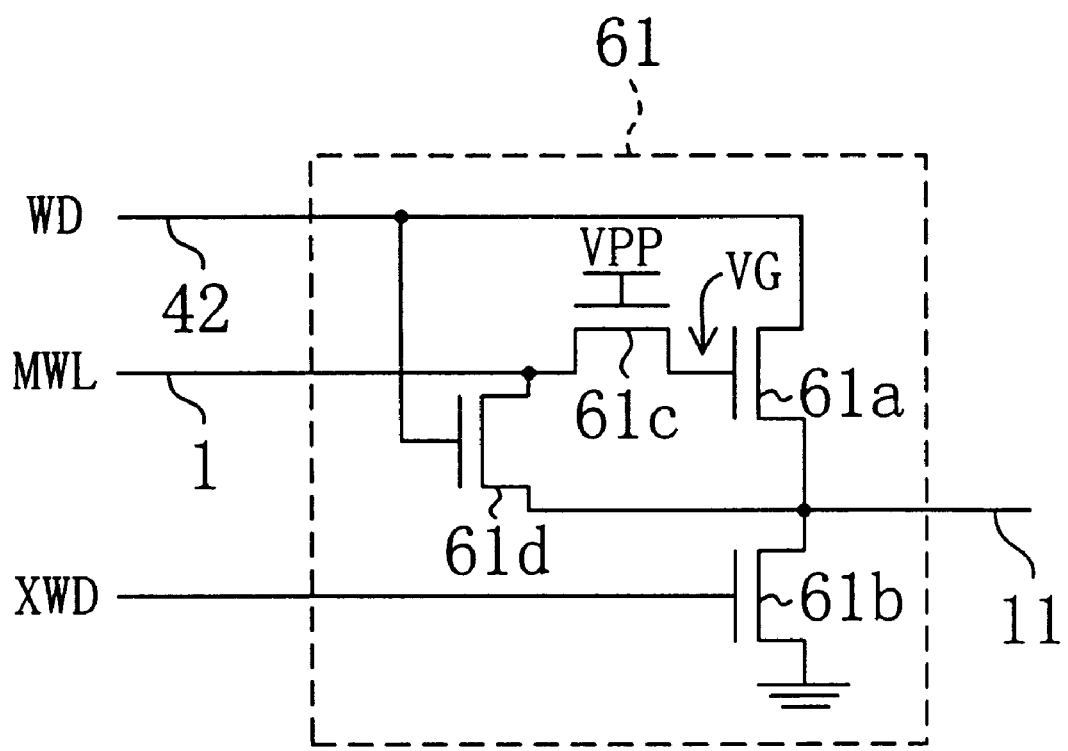
FIG. 3 is an equivalent circuit diagram of a sub-word driver for the semiconductor memory device of the first embodiment.

FIG. 3 illustrates an exemplary internal configuration of each sub-word driver. It should be noted that although the configuration of the sub-word driver 61 is illustrated in FIG. 3, every other driver 62, 63, . . . , 84 has the same configuration as the driver 61. The driver 61 shown in FIG. 3 is composed of a plurality of n-channel MOS transistors. Specifically, the driver 61 includes first and second n-channel MOS transistors 61a and 61b that are connected in series to each other. The connection point thereof is connected as an output node to the sub-word line 11. The sub-word select line 42 is connected to the first transistor 61a, and the main word line 1 is connected to the gate of the first transistor 61a via a third n-channel MOS transistor 61c. The second transistor 61b is grounded, and a signal XWD, obtained by inverting a sub-word select signal WD on the sub-word select line 42, is applied to the gate of the second transistor 61b. A high voltage $V_{PP}$ is applied to the gate of the third transistor 61c. The sub-word driver 61 further includes a fourth n-channel MOS transistor 61d, which is connected to the main word line 1 and the output node, and the gate of which is connected to the sub-word select line 42.

Figure 4A:
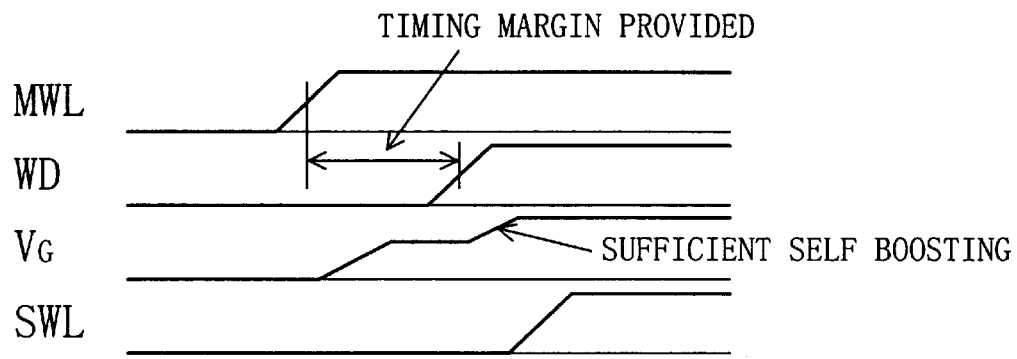
FIG. 4(a) illustrates waveforms of respective components in the semiconductor memory device of the first embodiment during a normal operation thereof.
Figure 4B:
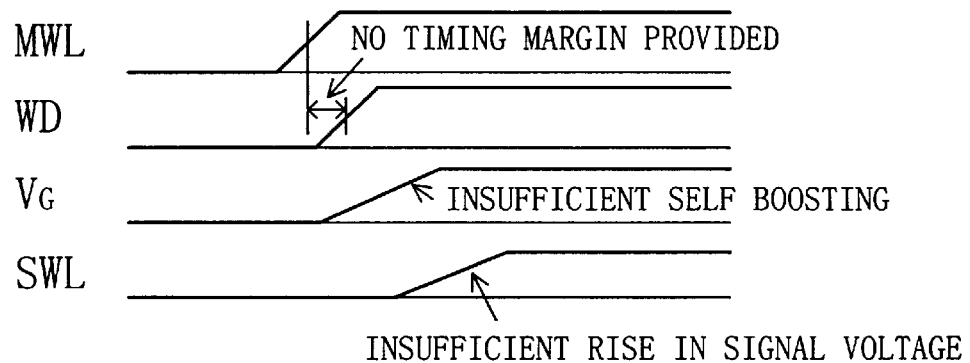
FIG. 4(b) illustrates waveforms of respective components in the device where no timing margin is provided between a main word line and a sub-word line.

The operation of the sub-word driver 61, 62, ..., 84, composed of n-channel MOS transistors as shown in FIG. 3, will be described. In order to supply the high voltage $V_{PP}$ to the sub-word line 11, the gate voltage $V_G$ of the first transistor 61a should be raised to a voltage sufficiently higher than the high voltage $V_{PP}$. When the sub-word driver 61, 62, ..., 84 operates normally, the main word line 1 is enabled first (i.e., a main word line signal MWL on the main word line 1 rises) to increase the gate voltage $V_G$ at the first transistor 61a. And then the sub-word select line 42 is enabled (i.e., the sub-word select signal WD on the sub-word select line 42 rises) as shown in FIG. 4(a). Accordingly, capacitance coupling is caused between the gate and source of the first transistor 61a, which boosts the gate voltage $V_G$ thereof by itself to a voltage exceeding the high voltage $V_{PP}$. As a result, the sub-word select signal WD on the sub-word select line 42 (i.e., the high voltage $V_{PP}$) is supplied to the sub-word line 11 as it is, thereby increasing the voltage level of a sub-word signal SWL on the sub-word line 11 up to the high voltage $V_{PP}$. On the other hand, if a sufficient timing margin is not provided between the enablement of the main word line 1 and that of the sub-word select line 42, the signals MWL, WD and SWL and the voltage $V_G$ rise as shown in FIG. 4(b). Specifically, before the gate voltage $V_G$ of the first transistor 61a has been increased sufficiently due to the enablement of the main word line 1, the sub-word select line 42 is enabled and the first transistor 61a starts to boost its gate voltage $V_G$. In such a situation, since the gate voltage $V_G$ of the first transistor 61a cannot be increased sufficiently, the high voltage $V_{PP}$ on the sub-word select line 42 is not supplied to the sub-word line 11 as it is. As a result, the voltage level of the sub-word signal SWL on the sub-word line 11 cannot be raised up to the high voltage $V_{PP}$. According to this embodiment, however, since a sufficient timing margin is ensured, the sub-word driver 61, 62, ..., 84 can always operate normally. The detailed reason thereof will be described later.

Responsive to predetermined address signals supplied thereto, one of the row decoders 51, 52, ..., 56 is selected from all the blocks to drive the associated main word line connected thereto. For example, supposing the number of blocks is 16 and the number of main word lines is 128, a 7-bit row address signal (main word line selecting signal) AX2 through AX8 and a 4-bit row address signal (block selecting signal) AX9 through AX12 are supplied to select a particular row decoder. Responsive to other predetermined address signals supplied thereto, the sub-word selectors 91, 92, 93 select one of the sub-word select lines that are associated with the block including a main word line driven by the row decoders. For example, supposing the number of blocks is 16 and the number of sub-word select lines per block is 4, a 4-bit row address signal (block selecting signal) AX9 through AX12 and a 2-bit row address signal (sub-word select line selecting signal) AX0 and AX1 are supplied.

The operation of the semiconductor memory device with such a configuration will be described.

When a row address is input to this DRAM, one of the row decoders (e.g., the row decoder 51), associated with the row address, is selected, and the associated main word line (i.e., the main word line 1) is enabled. The sub-word selector 91, belonging to the same block as the selected row decoder 51, is selected, and one of a plurality of sub-word select lines 41 and 42 connected to the selected sub-word selector 91 (e.g., the sub-word select line 41) is enabled by the selected sub-word selector 91. First, a signal is transmitted through the parallel portion 41a of the selected sub-word select line 41, which is placed in parallel to the main word line 1, with an substantially equal propagation delay to that of the main word line 1.

Thereafter, the signal is transmitted through the vertical portions 41b of the sub-word select line 41 downward in FIG. 2. By enabling the main word line 1 and the sub-word select line 41, sub-word drivers 62, 74 are selected in each corresponding sub-array B. As a result, the sub-word lines 12 and 24, connected to these drivers 62 and 74, respectively, are enabled to select the memory cells connected to these lines 12 and 24.

In this case, the difference in delay between the signal transmitted through the main word line 1 and that transmitted through the vertical portion 41b downward in the sub-array B shown in FIG. 2 is very small, because the signal transmitted through the vertical portion 41b is propagated within a single sub-array B. Accordingly, only by securing a timing margin between the main word line 1 up to the sub-word drivers 62 and 74 and the sub-word select line 41 within the sub-array B, the signal transmission timing between the row decoder 51 and the sub-word selector 91 can be easily controlled. In the foregoing example, a particular main word line 1 and an associated sub-word select line 41 are supposed to be selected for the illustrative purpose only. The same statement applies to the operation performed where any other pair of main word and sub-word select lines is selected, and the description thereof will be omitted herein.

The difference in signal propagation delay caused by disabling the main word line 1 is also very small. In this embodiment, the parallel portions 41a, 42a, ..., 46a of the sub-word select lines 41, 42, ..., 46 are placed in parallel to the main word lines 1, 2, ..., 6. The vertical portions 41b, 42b, 46b of the sub-word select lines 41, 42, ..., 46, crossing the main word lines 1, 2, ..., 6 at right angles, are placed only within the associated sub-array B. Accordingly, a timing margin between the disablement of the main word lines 1, 2, ..., 6 and that of the sub-word select lines 41, 42, ..., 46 can be very small. In the conventional configuration, each sub-word select line, crossing a plurality of main word lines at right angles, passes through a plurality of sub-arrays. Thus, a signal, transmitted through the sub-word select line vertically to the main word lines, is delayed a great deal, and a large timing margin should be secured between the signals transmitted through the main word line and the sub-word select line. As a result, the operation of the conventional DRAM is delayed for that margin. In contrast, since the timing margin may be small according to the present invention, the DRAM can be operated faster.

In addition, the parallel portions 41a, 42a, ..., 46a of the sub-word select lines 41, 42, ..., 46 are placed in the free spaces over the banks 131, 132, ..., 136 of sense amplifiers. Accordingly, the layout area does not increase.

In the example illustrated in FIG. 2, the number of sub-word select lines provided within each bank of sub-word drivers is two (e.g., 41b and 42b). The same effects are attainable if the number is four, eight or sixteen. In other words, the number of sub-word select lines is not limited according to the present invention.

EMBODIMENT 2

Figure 5:
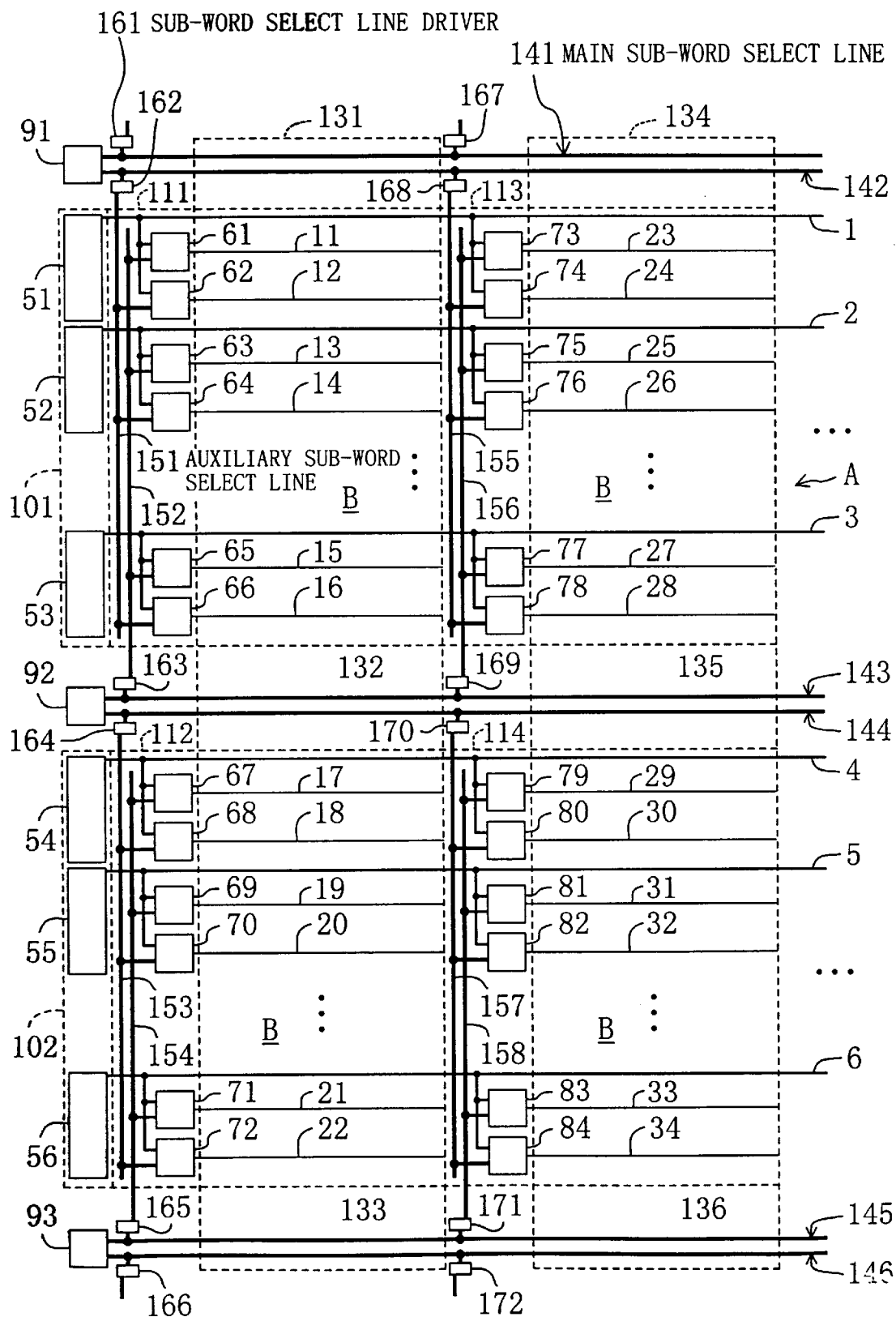
FIG. 5 is a schematic representation illustrating a detailed arrangement of a semiconductor memory device according to a second exemplary embodiment of the present invention.

FIG. 5 illustrates a semiconductor memory device according to a second exemplary embodiment of the present invention. In FIG. 5, each of sub-word select lines consists of: one main sub-word select line 141, 142, 143, 144, 145, 146 placed in parallel to the main word lines 1, 2, . . . , 6; and a plurality of auxiliary sub-word select lines 151 and 152, 153 and 154, 155 and 156, 157 and 158, which are provided over an associated bank 111, 112, 113, 114 of sub-word drivers within the associated sub-array B to cross the main word lines 1, 2, . . . , 6 at right angles. At the intersection between each main sub-word select line 141, 142, . . . , 146 and an associated auxiliary sub-word select line 151, 152, . . . , 158, or between each bank 131, 132, . . . , 136 of sense amplifiers and an associated bank 111, 112, 113, 114 of sub-word drivers, a sub-word select line driver 161, 162, . . . , 172 is disposed.

Figure 6:
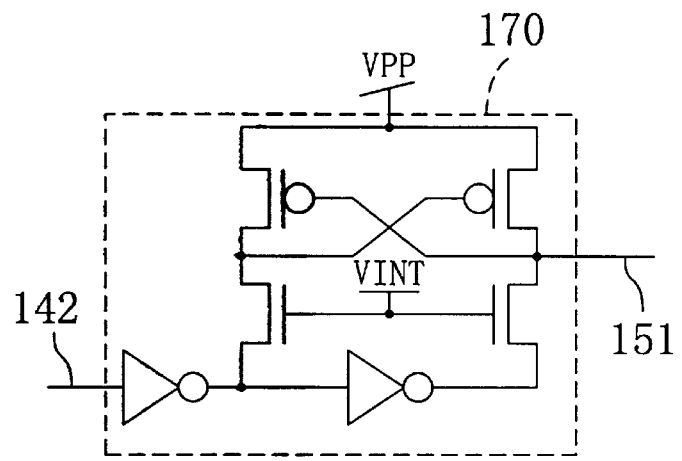
FIG. 6 is an equivalent circuit diagram of a level shifter included in a sub-word select line driver for the semiconductor memory device of the second embodiment.
Figure 7:
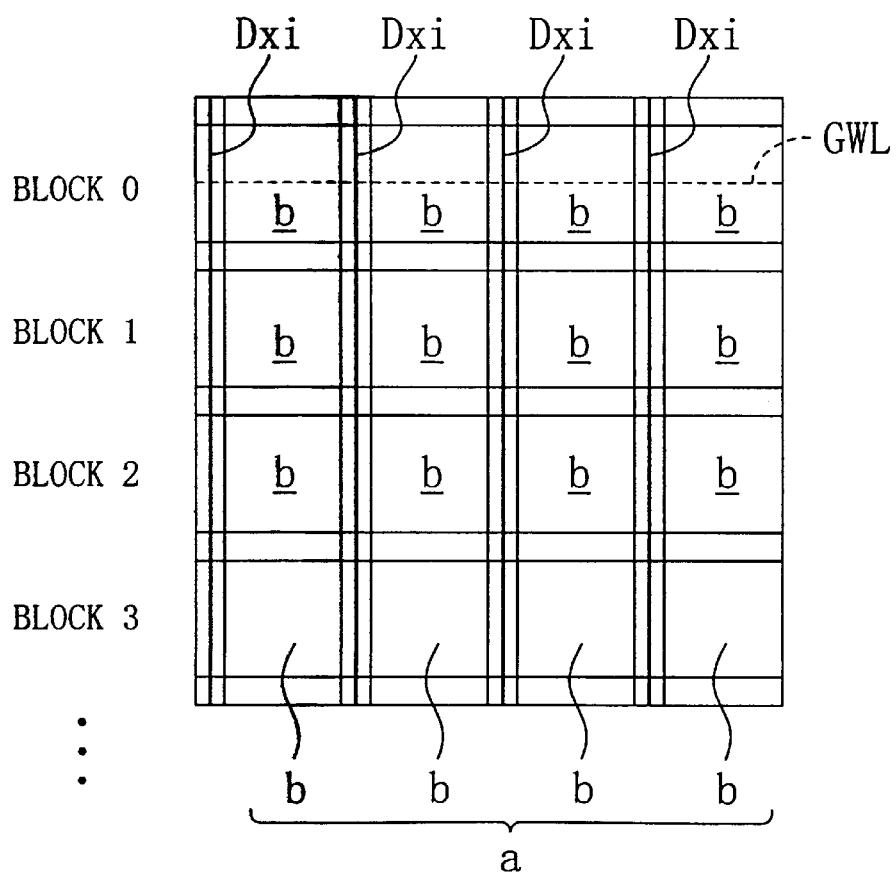
FIG. 7 is a schematic representation illustrating a simplified arrangement of a prior art semiconductor memory device.

In each sub-word select line driver 161, 162, . . . , 172, a level shifter 170 shown in FIG. 6 is disposed. The level shifter 170, which is disposed in the sub-word select line driver 162, for example, is connected to the main sub-word select line 142 and the auxiliary sub-word select line 151. While the potential on the main sub-word select line 142 is at H level, the level shifter 170 shifts the potential level on the auxiliary sub-word select line 151 to a boosted voltage $V_{PP}$, which is higher than a write voltage $V_{INT}$ for the memory cell. On the other hand, while the potential on the main sub-word select line 142 is at L level, the level shifter 170 sets the potential on the auxiliary sub-word select line 151 at the ground potential. Since the potentials on sub-word lines should be the boosted voltage $V_{PP}$ higher than the write voltage $V_{INT}$ of the memory cell, the boosted voltage $V_{PP}$ is transmitted through the auxiliary sub-word select line 151 to the associated sub-word lines 12, 14 and 16.

In the other respects, the device shown in FIG. 5 has the same configuration as that of the device shown in FIG. 2. Thus, the same components are identified by the same reference numerals and the description thereof will be omitted herein.

In this embodiment, the main sub-word select lines 141, 142, . . . , 146 are placed in parallel to the main word lines 1, 2, . . . , 6. Each of the main sub-word select lines 141, 142, . . . , 146 is separated from the associated pair of auxiliary sub-word select lines 151 and 152, 153 and 154, 155 and 156, 157 and 158. The signal load of each of the main sub-word select lines 141, 142, . . . , 146 is the associated sub-word select line driver 161, 162, . . . , 172. These sub-word select line drivers 161, 162, . . . , 172 are arranged at the same pitch as the sub-word drivers 61, 62, . . . , 84 connected to the main word lines 1, 2, . . . , 6. Accordingly, the signal propagation delay through the main sub-word select lines 141, 142, . . . , 146 is even closer to that through the main word lines 1, 2, ... 6.

On the other hand, each pair of auxiliary sub-word select lines 151 and 152, 153 and 154, 155 and 156, 157 and 158 is supposed to drive only an associated set of sub-word drivers 61 through 66, 67 through 72, 73 through 78, 79 through 84, respectively, within the sub-array B to which the pair belongs. Thus, the signal propagation delay on the pair of lines is very small. Accordingly, as in the first embodiment, the difference in signal propagation delay between the main word lines 1, 2, . . . , 6 and the auxiliary sub-word select lines 151, 152, . . . , 158 until the signal reaches the sub-word driver is substantially equal among the respective sub-arrays B. That is to say, only by securing a signal transmission timing margin between the main word lines 1, 2, . . . , 6 and the auxiliary sub-word select lines 151, 152, . . . , 158 in view of the difference in propagation delay, the signal transmission timing between the row decoders 51, 52, . . . , 56 and the sub-word selectors 91, 92, 93 can be controlled. The same statement applies to the situation where the sub-word lines are disabled.

As described above, in this embodiment, the main sub-word select lines 141, 142, . . . , 146 are placed in parallel to the main word lines 1, 2, . . . , 6 and the loads on these two types of lines are substantially equalized. Thus, the difference in signal propagation delay between the main word lines 1, 2, 6 and the main sub-word select lines 141, 142, . . . , 146 can be very small. As a result, the DRAM can operate faster.

In addition, since the sub-word select line drivers 161, 162, . . . , 172 are disposed at the respective intersections between the banks 131, 132, . . . , 136 of sense amplifiers and the banks 111, 112, 113, 114 of sub-word drivers. Accordingly, the layout area does not increase even though the sub-word select line drivers 161, 162, . . . , 172 are additionally provided.

Furthermore, since the level shifter 170 is provided in each of the sub-word select line drivers 161, 162, . . . , 172, the signals can be transmitted through the main sub-word select lines 141, 142, . . . , 146 at a voltage level lower than the level (boosted level $V_{PP}$) on the auxiliary sub-word select lines 151, 152, . . . , 158. Accordingly, the current consumed by the main sub-word select lines 141, 142, . . . , 146 can be reduced. As a result, the DRAM can be operated with lower power dissipation.

What is claimed is:

1. A semiconductor memory device comprising:

an array of memory cells arranged in columns and rows, the array being divided into a plurality of sub-arrays;

a plurality of main word lines, each said main word line extending over a number of the sub-arrays that are arranged on the same row;

a plurality of sub-word select lines;

a plurality of sub-word drivers, each said sub-word driver being selected by specifying particular one of the main word lines and particular one of the sub-word select lines in combination, more than one of the sub-word drivers being associated with each said sub-array; and a plurality of sub-word lines, each said sub-word line being driven by associated one of the sub-word drivers and connected to associated one of the memory cells, wherein the sub-arrays are classified into a plurality of blocks, each said block including an associated set of the sub-arrays arranged on the same row, and wherein more than one of the sub-word select lines are associated with each said block, and wherein each said sub-word select line includes: a portion placed in parallel to the main word lines; and a plurality of portions that are all connected to the parallel portion and arranged in the respective sub-arrays within the same block to cross the main word lines at right angles.

2. The device of claim 1, further comprising:

a plurality of row decoders arranged in a direction vertical to the main word lines, each said row decoder driving associated one of the main word lines; and a plurality of sub-word selectors arranged in the same direction as the row decoders, each said sub-word selector being associated with corresponding one of the blocks for selectively driving one of the sub-word select lines provided in the block.

3. The device of claim 2, wherein each said sub-word selector, associated with corresponding one of the blocks, is selected responsive to an address signal, and wherein the address signal includes: a signal used for selecting one of blocks; and a signal used for selecting one of the sub-word select lines within the selected block.

4. The device of claim 2, further comprising banks of sense amplifiers, each said bank being associated with one of the sub-arrays, each said amplifier amplifying a signal stored in associated one of the memory cells, and wherein the parallel portion of each said sub-word select line is placed over associated ones of the banks of sense amplifiers.

5. A semiconductor memory device comprising:

an array of memory cells arranged in columns and rows, the array being divided into a plurality of sub-arrays;

a plurality of main word lines, each said main word line extending over a number of the sub-arrays that are arranged on the same row;

a plurality of sub-word select lines;

a plurality of sub-word drivers, each said sub-word driver being selected by specifying particular one of the main word lines and particular one of the sub-word select lines in combination, more than one of the sub-word drivers being associated with each said sub-array; and a plurality of sub-word lines, each said sub-word line being driven by associated one of the sub-word drivers and connected to associated one of the memory cells, wherein the sub-arrays are classified into a plurality of blocks, each said block including an associated set of the sub-arrays arranged on the same row, and wherein more than one of the sub-word select lines are associated with each said block, and wherein each said sub-word select line includes:

a main sub-word select line placed in parallel to the main word lines; and a plurality of auxiliary sub-word select lines, each of the auxiliary sub-word select lines being placed within each said sub-array to cross the main word lines at right angles and connected to associated ones of the sub-word drivers, the auxiliary sub-word select lines being driven when the main sub-word select line is driven.

6. The device of claim 5, further comprising:

a plurality of row decoders arranged in a direction vertical to the main word lines, each said row decoder driving associated one of the main word lines; and a plurality of sub-word selectors arranged in the same direction as the row decoders, each said sub-word selector being associated with corresponding one of the blocks for selectively driving the main sub-word select line of one of the sub-word select lines provided in the block.

7. The device of claim 6, wherein each said sub-word selector, associated with corresponding one of the blocks, is selected responsive to an address signal, and wherein the address signal includes: a signal used for selecting one of blocks; and a signal used for selecting one of the sub-word select lines within the selected block.

8. The device of claim 6, further comprising banks of sense amplifiers, each said bank being associated with one of the sub-arrays, each said amplifier amplifying a signal stored in associated one of the memory cells, and wherein the main sub-word select line of each said sub-word select line is placed over associated ones of the banks of sense amplifiers.

9. The device of claim 6, further comprising a plurality of sub-word select line drivers for the respective sub-arrays, each said sub-word select line driver being provided for, and selected by, associated one of the main sub-word select lines, and wherein each said sub-word select line driver drives a corresponding one of the auxiliary sub-word select lines for associated one of the sub-arrays.

10. The device of claim 9, further comprising banks of sense amplifiers, each said bank being associated with one of the sub-arrays, each said amplifier amplifying a signal stored in associated one of the memory cells, and wherein each said sub-word select line driver is placed at an intersection between associated one of the banks of sense amplifiers and an associated bank of the sub-word drivers within the associated sub-array.

11. The device of claim 9, wherein each said sub-word select line driver includes a level shifter for generating a boosted signal level in response to a signal on associated one of the main sub-word select lines, and wherein the level shifter makes a signal level on associated auxiliary sub-word select lines higher than the signal level on the main sub-word select line.

* * * * *

UNITED STATES PATENT AND TRADEMARK OFFICE
CERTIFICATE OF CORRECTION

PATENT NO. : 6,118,723
DATED : September 12, 2000
INVENTOR(S) : Masashi Agata et al.

It is certified that error appears in the above-identified patent and that said Letters Patent is hereby corrected as shown below:

On the cover page of the patent at [56] References Cited, under "Foreign Patent Documents" insert --06195964  7/1994 Japan--.

Signed and Sealed this

First Day of May, 2001

Attest:

NICHOLAS P. GODICI

*Attesting Officer*   *Acting Director of the United States Patent and Trademark Office*